(12) United States Patent  
Faller

(10) Patent No.: US 8,594,320 B2
(45) Date of Patent: Nov. 26, 2013

(54) HYBRID ECHO AND NOISE SUPPRESSION METHOD AND DEVICE IN A MULTI-CHANNEL AUDIO SIGNAL

(75) Inventor: Christof Faller, Chavannes-Près-Renes (CH)

(73) Assignee: (EPFL) Ecole Polytechnique Federale de Lausanne, Lausanne (CH)

( * ) Notice: Subject to any disclaimer, the term of this patent is extended or adjusted under 35 U.S.C. 154(b) by 1511 days.

(21) Appl. No.: 11/912,082

(22) PCT Filed: Apr. 19, 2006

(86) PCT No.: PCT/EP2006/003582
§ 371 (c)(1),
(2), (4) Date: Oct. 19, 2007

(87) PCT Pub. No.: WO2006/111370
PCT Pub. Date: Oct. 26, 2006

(65) Prior Publication Data
US 2008/0170706 A1 Jul. 17, 2008

(30) Foreign Application Priority Data

Apr. 19, 2005 (EP) .................................. 05103145

(51) Int. Cl.
*H04M 9/08* (2006.01)
*H04M 1/00* (2006.01)
*H04M 9/00* (2006.01)
(52) U.S. Cl.
USPC ................................. 379/406.01; 379/390.01
(58) Field of Classification Search
USPC .................................. 381/66, 93, 94.1, 94.3; 379/406.01–406.16; 370/289, 370/282–286; 455/570
See application file for complete search history.

(56) References Cited

U.S. PATENT DOCUMENTS 5,661,813 A * 8/1997 Shimauchi et al. ............. 381/66
5,901,230 A * 5/1999 Walker ............................ 381/66
(Continued)

FOREIGN PATENT DOCUMENTS

EP   0 895 397 A2   2/1999
EP   1 715 669      10/2006
WO   03/010996 A2   2/2003

OTHER PUBLICATIONS

Chen et al (Suppressing Acoustic Echo in a Spectral Envelope Space, IEE, 2005).*

(Continued)

*Primary Examiner* — Daniel Luke
*Assistant Examiner* — Khaja Ahmad
(74) *Attorney, Agent, or Firm* — DLA Piper LLP US

(57) ABSTRACT

Acoustic echo control and noise suppression in telecommunication systems. The proposed method of processing multi-channels audio loudspeakers signals and at least one microphone signal, comprises the steps of: transforming the input microphone signals (y1 (n), y2 (n), . . . , yM (n)) into input microphone short-time spectra, computing a combined loudspeaker signal short-time spectrum [X(i,k)] from the loudspeaker signals, (x1 (n), x2 (n), . . . , xL (n)), computing a combined microphone signal short-time spectrum [Y(i,k)] from the input microphone signal, (y1 (n), y2 (n), . . . , yM (n)), estimating a magnitude or power spectrum of the echo in the combined microphone signal short-time spectrum, computing a gain filter (G(i,k)) for magnitude modification of the input microphone short-time spectra, applying the gain filter to at least one of the input microphone spectra, converting the filtered input microphone spectra into the time domain (e1 (n), e2 (n), . . . , eM (n)).

21 Claims, 7 Drawing Sheets

(56) References Cited

U.S. PATENT DOCUMENTS

| | | |
|---|---|---|
| 6,249,581 B1 | 6/2001 | Kok |
| 6,466,666 B1 | 10/2002 | Eriksson |
| 6,532,289 B1 | 3/2003 | Magid |
| 6,760,451 B1* | 7/2004 | Craven et al. .................... 381/98 |
| 2001/0016020 A1* | 8/2001 | Gustafsson et al. ........... 375/346 |
| 2002/0054685 A1* | 5/2002 | Avendano et al. ............... 381/66 |
| 2003/0156273 A1 | 8/2003 | Kageyama et al. |
| 2004/0028217 A1 | 2/2004 | Ebenezer et al. |
| 2004/0057574 A1 | 3/2004 | Faller |
| 2004/0062386 A1 | 4/2004 | Tahernezhaadi et al. |
| 2005/0008143 A1* | 1/2005 | Lang et al. ................. 379/406.1 |
| 2006/0153360 A1* | 7/2006 | Kellermann et al. .... 379/406.08 |

OTHER PUBLICATIONS

Christophe et al (Estimating the delay and coloration effect of the acoustic echo path for low complexity echo suppression, Sep. 2005).*

Stefan_et_al (A Psychoacoustic Approach to Combined Acoustic Echo Cancellation and Noise Reduction, Stefan Gustafsson, Member, IEEE, Rainer Martin, Senior Member, IEEE, Peter Jax, Student Member, IEEE, and Peter Vary, IEEE Transactions on Speech and Audio Processing, vol. 10, No. 5, Jul. 2002).*

International Search Report, International Patent Application No. PCT/EP2006/003582, International Filing Date: Apr. 19, 2006.

Avendano, C., "Acoustic Echo Suppression in the STFT Domain," IEEE Workshop on Applications of Signal Processing to Audio and Acoustics 2001, New Paltz, New York, pp. 175-178, (Oct. 21-24, 2001).

Faller, C., and Chen, J., "Suppressing Acoustic Echo in a Spectral Envelope Space," IEEE Transaction on Speech and Audio Processing, pp. 1-15, (2005).

Faller, C., and Tournery, C., "Estimating the Delay and Coloration Effect of the Acoustic Echo Path for Low Complexity Echo Suppression," Proc. Intl. Works. on Acoust. Echo and Noise Control (IWAENC), Eindhoven, The Netherlands, (Sep. 2005).

Sim, B.L..., et al., "A Parametric Formulation of the Generalized Spectral Subtraction Method," IEEE Transactions on Speech and Audio Processing, IEEE Service Center, New York, New York, vol. 6, No. 4, (Jul. 1998).

Sondhi, M.M., et al., "Stereophonic Acoustic Echo Cancellation—An Overview of the Fundamental Problem," IEEE Signal Processing Letters, vol. 2, No. 8, (Aug. 1995).

J. Meyer et at, "Multi-Channel Speech Enhancement in a Car Environment Using Wiener Filtering and Spectral Subtraction", Proc. ICASSP-97, vol. 2, pp. 1167-1170, Munich, Germany, Apr. 21-24, 1997.

International Search Report issued in PCT/EP2006/003581, dated Jul. 27, 2006.

Written Opinion issued in PCT/EP2006/003581, dated Jul. 26, 2006.

Image File Wrapper of U.S. Appl. No. 11/912,068.

* cited by examiner

HYBRID ECHO AND NOISE SUPPRESSION METHOD AND DEVICE IN A MULTI-CHANNEL AUDIO SIGNAL

INTRODUCTION

Acoustic echo control is a necessary component for a full-duplex hands-free telecommunication system to eliminate undesired echo signals that result from acoustic coupling between a loudspeaker and a microphone. If an acoustic echo canceller (AEC) is used, usually also an acoustic echo suppressor (AES) is used (in series after the AEC) to remove residual echoes which occur due to the constantly changing echo paths or when sudden echo path changes occur. Also, often a noise suppressor (NS) is applied for removing stationary noise from the microphone signal.

Recently, systems have been proposed which do not employ an AEC, but do all echo removal using an AES [1, 2]. However, these systems have still high complexity [1], do not efficiently address NS within their core, and are not [2] or only inefficiently [1] applicable for stereo and multi-channel echo control.

We are proposing schemes for AES and NS which have low complexity, high robustness, and are scalable for stereo and multi-channel audio without a need for introducing loudspeaker signal distortion. Conventional echo control algorithms for stereo or multi-channel audio introduce this distortion since otherwise the echo path impulse response often can not be estimated (the so-called "non-uniqueness" problem [3]).

NOTATION AND VARIABLES n time-domain time index
i STFT spectrum frequency index
k STFT spectrum time index
x(n) loudspeaker signal
$x_l(n)$ loudspeaker signal with channel index l
L Number of loudspeaker signals
ω(n) noise signal component in microphone signal
y(n) microphone signal
$y_m(n)$ microphone signal with channel index m
M number of microphone signals
e(n) microphone signal after echo/noise control
$e_m(n)$ microphone signal after echo/noise control with channel index m
w STFT window size (samples)
H STFT window hop size (samples)
X(i,k) STFT of x(n) (defined similarly for other signals)
|X(i,k)| Magnitute spectrum of x(n)
Ŷ(i,k) Estimation of Y(i,k)
G(i,k) Real-valued gain filter for echo/noise removal
$G_v(i,k)$ Real-valued gain filter values for coloration correction
$G_1(i,k), G_2(i,k)$ Real-valued gain filter values for coloration correction
d delay estimate of acoustic echo path (relative to spectrum time index)

BACKGROUND

In the following, commonly used techniques for AEC, AES, and NS are described.
Acoustic Echo Canceler (AEC)

Traditionally, echo cancellation is accomplished by adaptively identifying the echo path impulse response and subtracting an estimate of the echo signal from the microphone signal. The far-end talker signal x(n) (loudspeaker signal) goes through the echo path, whose impulse response is modeled as an FIR filter, and adds to the microphone signal y(n) together with the near-end talker signal v(n) and the ambient noise w(n):

$$y(n) = h^T x(n) + v(n) + w(n), \quad (1)$$

where $$x(n) = [x(n), x(n-1), \ldots x(n-J+1)]^T,$$

$$h = [h_0, h_1, h_{J-1}]^T,$$

J is the length of the echo path impulse response, and $^T$ denotes the transpose of a vector or a matrix. To cancel the echo in the microphone signal, an echo estimate ŷ(n) is needed, which is generated by passing the far-end talker signal through an FIR filter $$\hat{h} = [\hat{h}_0, \hat{h}_1, \ldots \hat{h}_{K-1}]^T \quad (2)$$

of length K (generally less than J), $$\hat{y}(n) = [\hat{h}^T, 0] x(n) \quad (3)$$

The FIR filter coefficients are estimated adaptively in time. Subtracting ŷ(n) from the microphone signal y(n) yields the error signal $$e(n) = y(n) - \hat{y}(n) \quad (4)$$

The mean square error (MSE) can be expressed as $$E\{e^2(n)\} = E\{(y(n) - \hat{y}(n))^2\} \quad (5)$$

where E{•} denotes mathematical expectation. The objective of the AEC is to estimate an ĥ that minimizes E{$e^2(n)$}.

There is a vast literature addressing how to search for the optimum ĥ using adaptive techniques. Commonly used algorithms include normalized least-mean-square (NLMS), recursive least-squares (RLS), proportionate NLMS (PN-LMS), affine projection algorithm (APA), etc.

During doubletalk (when the talker at the near-end is talking, i.e. v(n)≠0, usually the adaptive filter coefficients are "frozen" to prevent that the near-end signal v(n) has a negative effect on the adaptive filter in terms of estimating the acoustic echo path. For this purpose, a doubletalk detector is used.

Another solution was described to suppress the echo in an audio signal in the document US 2004/0057574. This is achieved by computing the spectral envelopes of the loudspeaker and microphone signals and determining the spectral envelope of the echo signal using adaptive filters. This approach attempts to continuously estimate the time varying spectral envelope of the echo signal. The problem with this technique is that the adaptive filters predicting the spectral envelopes need to re-converge every time when the properties of the loudspeaker signal change. That is, because the echo signal spectral envelope does not only depend on the loudspeaker signal spectral envelope but also on the loudspeaker signal itself. This signal dependence of the adaptive filters results in the problem that often the echo signal spectral envelope is not estimated precisely enough and the echo is not sufficiently removed.

BRIEF DESCRIPTION OF THE DRAWINGS

The invention will be better understood thanks to the attached Figures in which.

DETAILED DESCRIPTION OF THE INVENTION

Figure 1:
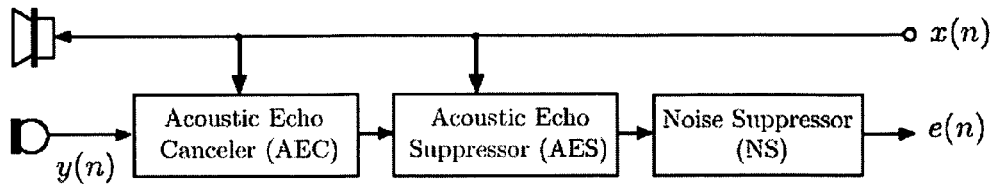
FIG. 1 shows a processing carried out in handsfree speech communication clients.

FIG. 1 illustrates a handsfree speech communication client system with an AEC, AES, and NS. The microphone signal is first processed in the Acoustic Echo Canceller (AEC), then passed to the Acoustic Echo Suppressor (AES) and finally transmitted to a Noise Suppressor (NS). It is to be noted that both AEC and AES need information from the loudspeaker signal.

Figure 2:
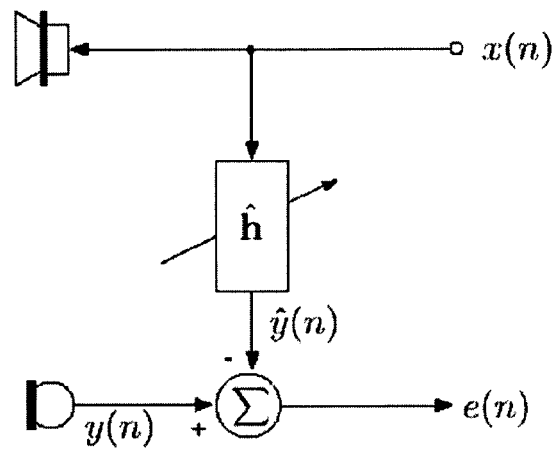
FIG. 2 shows a schematic diagram of an adaptive acoustic echo canceller.

FIG. 2 shows a general view of an adaptive echo canceller. The echo estimate $\hat{h}$ estimated from the loudspeaker signal $x(n)$ is subtracted from the microphone signal $y(n)$ to produce echo free microphone signal $e(n)$.

Noise Suppressor (NS)

Figure 3:
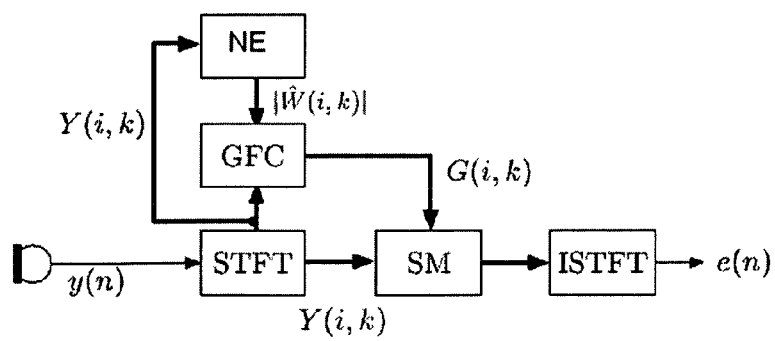
FIG. 3 shows a block diagram of a noise suppression algorithm using noise estimation analysis module.

FIG. 3 illustrates a noise suppressor (NS) based on spectral modification. Note that bold lines in the figures denote a plurality of spectral coefficients or subbands. This is a block diagram of a noise suppression algorithm by modifying the spectral magnitude, where STFT, NE, GFC, SM, and ISTFT stand for short-time Fourier transform (STFT), noise estimation (NE), gain filter computation (GFC), spectral modification (SM), and inverse short-time Fourier transform (ISTFT), respectively. Bold lines represent a plurality of spectral coefficients or subbands. First, the incoming microphone signal, $y(n)$ is partitioned into successive frames. The frame length is typically selected between 10 and 40 ms. A window function (e.g. Hann window) is applied to the signal for a better estimation. Then, the short-time Fourier spectrum, $Y(i,k)$, is obtained by applying a discrete short-time Fourier transform (STFT) to the windowed frame signal. Next, the magnitude (or power) spectrum of the noise contained in the microphone signal, $|W(i,k)|$ is estimated. There are several commonly used methods to estimate the noise magnitude spectrum. One possibility is to detect time periods of silence, i.e. when no speech signal is active. In these periods one then knows that all the power has been caused by the noise, yielding a noise magnitude (or power) spectrum estimate, $|\hat{W}(i,k)|$, of the noise.

In general, the noise suppressed spectrum $E(i,k)$ can be recovered through $$E(i,k)=G(i,k)Y(i,k) \quad (6)$$

where $G(i,k)$ is the so-called (real-valued) gain filter. The gain filter is computed as a function of the estimated noise magnitude spectrum $|\hat{W}(i,k)|$, e.g.

$$G(i,k) = \left[\frac{\max(|Y(i,k)|^\alpha - \beta|\hat{W}(i,k)|^\alpha, 0)}{|Y(i,k)|^\alpha}\right]^{\frac{1}{\alpha}} \quad (7)$$

where $\alpha$ is an exponent, and $\beta$ is a parameter introduced to control the amount of noise to be suppressed in case it is under (or over) estimated. Finally, the noise-suppressed output signal $e(n)$ is constructed, given $E(i,k)$, using the overlap-add technique with inverse STFT.

The described technique is often referred to as a spectral modification technique (or sometimes parametric Wiener filtering technique, or parametric spectral subtraction). It has been widely adopted for the purpose of additive noise suppression and speech enhancement.

Acoustic Echo Suppressor (AES)

Figure 4:
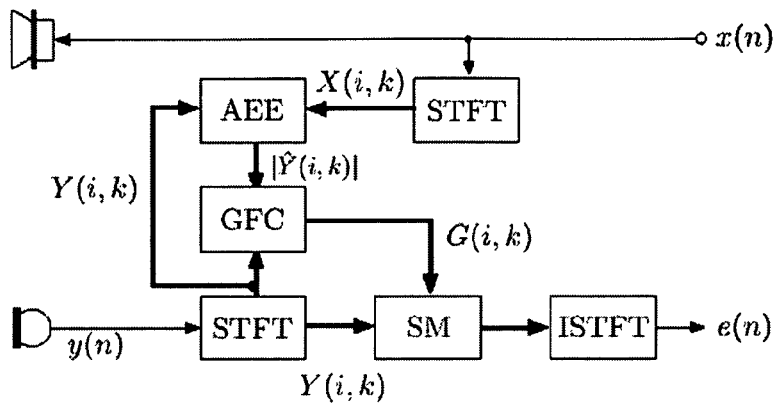
FIG. 4 shows a block diagram of a hybrid echo and noise suppression algorithm using acoustic echo and noise estimation modules.

An acoustic echo suppressor (AES) is illustrated in FIG. 4. This is a block diagram of an echo suppression algorithm by modifying the spectral magnitude, where STFT, AEE, SM, and ISTFT stand for short-time Fourier transform, acoustic echo estimation, gain filter computation, spectral modification, and inverse short-time Fourier transform, respectively. Bold lines represent a plurality of spectral coefficients or subbands. The AES is very similar to the NS, except that not a noise spectrum is estimated and removed, but an acoustic echo spectrum is estimated and removed.

The short-time Fourier spectra of the loudspeaker and microphone signal are obtained by applying STFT to the windowed corresponding time-domain signals. Next, the echo components are estimated by modeling the echo path and filtering the loudspeaker signal with the estimated echo path. The gain filter is then computed based on the estimated spectral magnitude spectra (or power spectra) of both the estimated echo signal $|\hat{Y}(i,k)|$ and the microphone signal $|Y(i,k)|$. (Note that as opposed to carrying out the echo spectrum estimation directly in the frequency domain, one could also apply time-domain processing similar to AEC and then apply STFT for obtaining short-term spectra, $\hat{Y}(i,k)$, of the echo signal). Similar formulas as for NS can be used for computing the output signal, i.e. (6) with a gain filter $$G(i,k) = \left[\frac{\max(|Y(i,k)|^\alpha - \beta|\hat{W}(i,k)|^\alpha, 0)}{|Y(i,k)|^\alpha}\right]^{\frac{1}{\alpha}} \quad (8)$$

Finally, the echo-suppressed output signal $e(n)$ is constructed, given $E(i,k)$ using the overlap-add technique with inverse STFT. Similar as an AEC, the AES uses a doubletalk detector which prevents that the acoustic echo path estimate diverges during doubletalk.

The weakness of the AES as described is that the estimation of the echo (magnitude) spectrum is highly computationally complex. Furthermore, the echo (magnitude) spectrum is rather sensitive to echo path changes, often causing the problem of "residual echoes". Note that this problem is less pronounced in the AES than AEC since the phase of the echo estimate is not used. However, echo path changes influencing the magnitude spectrum result in residual echoes also in the AES.

In the following, different aspects of the invention are described. This includes hybrid AES/NS processing, improved AES processing, multi-channel AES and NS processing, and how all these parts are combined to a powerful scalable AES and NS system. This is achieved through the method as claimed in the claim 1.

Hybrid Echo and Noise Suppression

Figure 5:
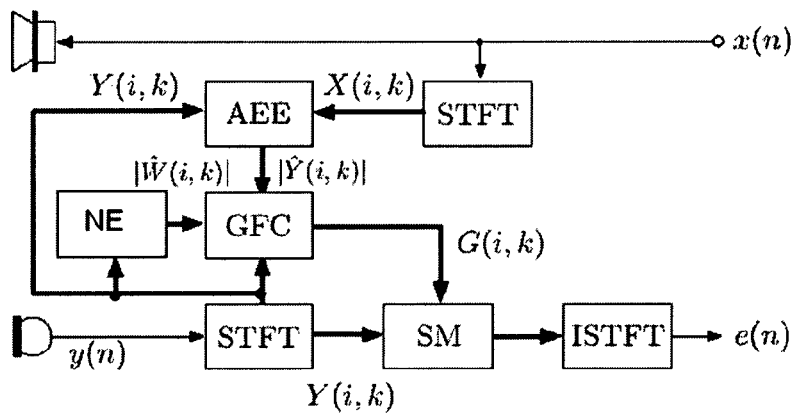
FIG. 5 shows a block diagram of a hybrid echo/noise suppression algorithm.

One aspect of the invention addresses efficient combination of AES and NS. FIG. 5 illustrates a straight forward and efficient way of combining an AES with a NS. This figure illustrates a block diagram of a hybrid echo/noise suppression algorithm by modifying the spectral magnitude, where STFT, AEE, NE, GFC, SM, and ISTFT stand for short-time Fourier transform, acoustic echo estimation, noise estimation, gain filter computation, spectral modification, and inverse short-time Fourier transform, respectively. Bold lines represent a plurality of spectral coefficients or subbands. The gain filter is computed as a function of the estimated echo magnitude spectrum $|\hat{Y}(i,k)|$ and estimated noise magnitude spectrum $|\hat{W}(i,k)|$, e.g.

$$G(i,k) = \left[ \frac{\max(|Y(i,k)|^\alpha - \beta_1 |\hat{Y}(i,k)|^\alpha + \beta_2 |\hat{W}(i,k)|^\alpha, 0)}{|Y(i,k)|^\alpha} \right]^{\frac{1}{\alpha}} \quad (9)$$

where the constants $\beta_1$ and $\beta_2$ can be used for controlling strength of the echo and noise suppression.

Echo Suppressor Estimating Delay and Coloration Correction Values

Another aspect of the invention addresses the weaknesses of the conventional AES in obtaining an estimate of the echo (magnitude) spectra. Not the acoustic echo path is estimated, but merely a global delay parameter and a filter characterizing the coloration effect of (the early part of) the acoustic echo path are estimated. This representation (delay and coloration correction values) is largely insensitive to acoustic echo path changes and is thus more robust than conventional methods which estimate the acoustic echo path. Additionally, the computational complexity is much lower as will be explained.

Figure 6:
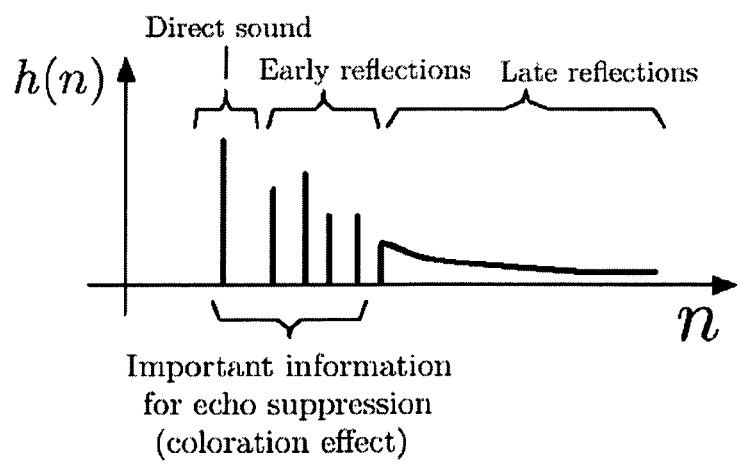
FIG. 6 shows the structure of a typical room impulse response (acoustic echo path).

In audio processing, with coloration it is usually meant that some frequency ranges are attenuated while other frequencies are not attenuated or amplified. This is called "coloration" because such audio signals are perceived as being "colored". For echo suppression, it is important to know which frequencies are attenuated, not modified, or amplified by the echo path. Given this information and delay information the echo signal can be suppressed. A room impulse response (the acoustic echo path) usually features the direct sound (sound that travels directly from the loudspeaker to the microphone), followed by a few early reflections, followed by a tail with late reflections with high density. FIG. 6 illustrates the structure of a typical room impulse response (acoustic echo path). The direct sound is followed by the early reflections and the late reflections. The direct sound and the early reflections have a coloration effect on the audio signal. The densely spaced late reflections do not or hardly color the signal. Thus, for obtaining the information for an effective echo suppression gain filter it is enough to only consider the direct sound and early reflections.

The problem of the prior art solution is circumvented by not attempting to directly estimate the time varying spectral envelope of the echo signal. Rather, properties of the acoustic echo path, which are expected to only vary slowly in time, are estimated. An overall delay between the loudspeaker and microphone signal is estimated. Furthermore, the coloration effect of the (early) acoustic echo path impulse response is estimated in the form of "coloration correction values". The coloration correction values are applied to the delayed loudspeaker signal to compute a coloration corrected loudspeaker signal. A gain filter is computed by using information of the coloration corrected loudspeaker signal and microphone signal. This time varying gain filter is applied to the microphone signal to remove the echo.

Figure 7:
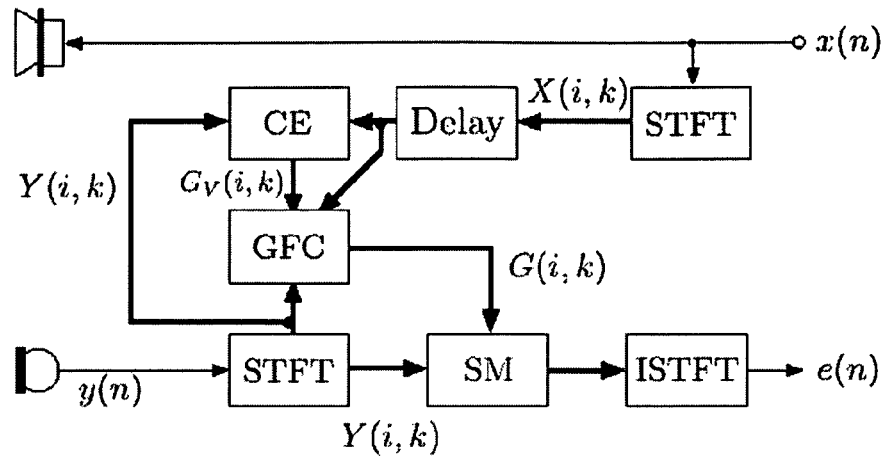
FIG. 7 shows a block diagram of the proposed acoustic echo suppression algorithm.

A specific implementation of the proposed scheme is illustrated in FIG. 7. The Delay and CE blocks estimate a delay and coloration correction values modeling the effect of the acoustic echo path on the loudspeaker signal. Given this information, the gain filter is computed such that it removes the undesired echo. Bold lines represent a plurality of spectral coefficients or subbands. The STFT spectra of the loudspeaker and microphone signal are computed. Then the delay d and coloration correction $G_v(i,k)$ (real-valued gain filter values) mimicking the effect of the early echo path is computed. As an approximate echo magnitude spectrum estimate the estimated delay and coloration correction values are applied to the loudspeaker signal spectra, $$|\hat{Y}(i,k)| = G_v(i,k) |X(i,k-d)| \quad (10)$$

Note that this is not a precise echo spectrum or magnitude spectrum estimate. But it contains the information necessary for applying echo suppression. The gain filter, $G(i,k)$, is computed by using (8) or (9) with (10). Then, the echo suppressed output signal is computed by applying the gain filter (6) and applying the inverse STFT with overlap add. Similar to an AEC or conventional AES, a doubletalk detector is used, i.e. the delay and coloration correction values are not updated during periods of doubletalk.

Note that as opposed to a STFT, any other filterbank or time-frequency transform may be used, which transforms a signal into a plurality of subbands or spectral coefficients.

Figure 8:
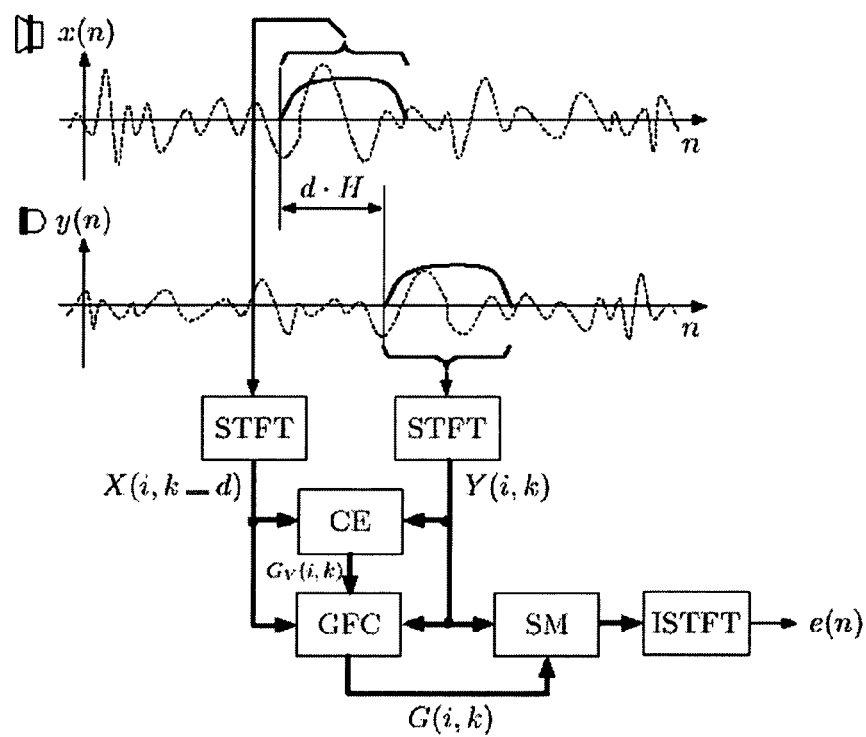
FIG. 8 shows a block diagram of the proposed acoustic echo in which the time relation between the loudspeaker and microphone signal transform windows are illustrated.

The described processing is illustrated with more detail in FIG. 8. This is a block diagram of the proposed acoustic echo suppression algorithm. The Delay and CE blocks estimate a delay and coloration correction values modeling the effect of the acoustic echo path on the loudspeaker signal. Given this information, the gain filter is computed such that it removes the undesired echo. Bold lines represent a plurality of spectral coefficients or subbands. The loudspeaker signal, x(n), and microphone signal, y(n), is shown. Example positions of the STFT windows are indicated. These windows are dH= (H=STFT windows window hop size) time domain samples apart (d is the delay estimate). Applying the STFT to these windowed signal portions yields the spectra X(i,k−d) and Y(i,k). The coloration correction estimation (CE in figure) yields the coloration correction values $G_v(i,k)$, mimicking the coloration effect of the acoustic echo path. The gain filter, G(i,k), which is applied to the microphone signal spectra, Y(i,k), is computed as a function of X(i,k−d), $G_v(i,k)$, and Y(i,k) e.g. by (8) or (9) with (10). Finally, the gain filter is applied to the microphone spectra (SM in the figure) before the inverse STFT is applied with overlap add.

The delay d is either set to a fixed constant value or estimated adaptively in time (if the delay of the direct sound from loudspeaker to microphone is not known, or if the time-relationship of the loudspeaker signal and microphone signal is not known). The coloration correction estimation values, $G_v(i,k)$, are estimated adaptively in time. An example on how to estimate delay and coloration correction values is given next.

Adaptive estimation of the delay d and coloration correction: In the following, a possibility is described how to adaptively in time estimate the delay and coloration estimation to be applied to the loudspeaker spectrum (10). For each spectral coefficient or subband, a normalized cross-correlation function is computed. The normalized cross-correlation function is $$\phi(i, b, k) = \frac{E\{|Y(i,k)X(i,k-b)|\}}{\sqrt{E\{|Y(i,k)|^2\}E\{|X(i,k-b)|^2\}}} \quad (11)$$

where b is the time lag index. Since the delay between x(n) and y(n) possibly varies in time, a short-time estimate of (11) is computed by $$\phi(i, b, k) = \frac{a_{12}(i, b, k)}{\sqrt{a_{11}(i, b, k)a_{22}(i, b, k)}} \quad (12)$$

where $$a_{12}(i, b, k) = \varepsilon|Y(i,k)X(i,k-b)| + (1-\varepsilon)a_{12}(i, b, k-1) \quad (13)$$
$$a_{11}(i, b, k) = \varepsilon \sum |Y(i,k)|^2 + (1-\varepsilon)a_{11}(i, b, k-1)$$
$$a_{22}(i, b, k) = \varepsilon|X(i,k-b)|^2 + (1-\varepsilon)a_{22}(i, b, k-1)$$

and $\varepsilon \in [0,1]$ determines the time-constant in seconds of the exponentially decaying estimation window $$T = \frac{1}{\varepsilon f_s} \quad (14)$$

where $f_s$ denotes the STFT spectrum sampling frequency.

Given the normalized cross-correlation functions (12) the delay for each spectral coefficient or subband is $$d(i) = \underset{b}{\operatorname{argmax}} \phi(i, b, k) \quad (15)$$

Note that in practice it is often enough to use a single delay value applied to the full signal. We use a single delay, computed by averaging d(i) over frequency index i. The coloration correction values are for example computed as $$G_v(i,k) = \frac{a_{12}(i, d(i), k)}{a_{22}(i, d(i), k)} \quad (16)$$

More generally speaking, $G_v(i,k)$ is computed such that the delay and coloration corrected loudspeaker magnitude spectrum (10) approximates the microphone signal magnitude spectrum in a least mean square error sense (during time periods when no doubletalk it present, i.e. during doubletalk (13) are not updated).

Improving echo suppression performance: Since the late reflections are ignored, the echo (10) will be often underestimated. This can be compensated by the gain filter computation, i.e. by setting the β parameter in (8) or the $\beta_1$ parameter in (9) to a value larger than one.

For further making the echo suppression effective, we use time smoothing of the gain filter, such that fully suppressed signal parts will have the effect that the successive few milliseconds of signal will also be suppressed. This is achieved by smoothing the gain filter over time in the logarithmic domain, i.e.

$$M(i,k) = \epsilon 20 \log_{10}(G(i,k)) + (1-\epsilon)M(i,k-1) \quad (17)$$

and the effectively applied gain filter is $$\tilde{G}(i,k) = 10^{M(i,k)/20} \quad (18)$$

The parameter $\epsilon$ determines the time-constant in seconds of the smoothing, $$T_{smooth} = \frac{1}{\varepsilon f_s} \quad (19)$$

where $f_s$ denotes the STFT spectrum sampling frequency. We use $T_{smooth}$=10 milliseconds.

Alternative implementation: Since usually for reasons of computational complexity and practicality the STFT is used with significant downsampling (e.g. we are using a window hop size equal to half the window size), the time resolution in the spectral domain is too low for applying (10) effectively (e.g. the true delay may lie between two STFT spectra in time). To circumvent this problem, the ideal scenario (without this time resolution limitation) is approximated by $$|Y(i,k)| = [G_1(i,k)|X(i,k-d)|^\delta + G_2(i,k)|X(i,k-d-1)|^\delta]^{1/\delta} \quad (20)$$

where d is a delay (with as low granularity as the spectrum time index k), δ is a constant influencing how the magnitude spectra are added (we use δ=2), and $G_1(i,k)$ and $G_2(i,k)$ are real-valued coloration correction gain filters. We found that using two coloration correction gain filters is enough, however, there may be scenarios where it would be desired to use more than two coloration correction gain filters (e.g. when the STFT window size is so small that a single gain filter can not capture most of the coloration effect of the acoustic echo path).

Figure 9:
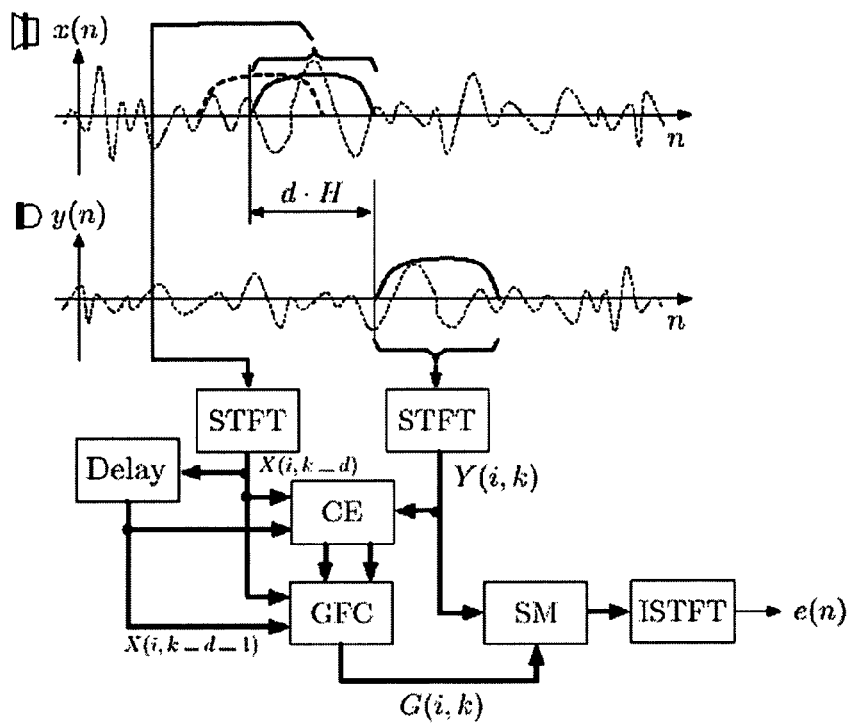
FIG. 9 shows a block diagram of the proposed acoustic echo suppression algorithm using two loudspeaker spectra.

FIG. 9 illustrates the alternative implementation (20) in detail. This is a block diagram of the proposed acoustic echo suppression algorithm. The Delay and CE blocks estimate the delay and coloration correction values mimicking the effect of the acoustic echo path on the loudspeaker signals. Given this information, the gain filter is computed such that it removes the undesired echo. Bold lines represent a plurality of spectral coefficients or subbands. The loudspeaker signal, x(n), and microphone signal, y(n), is shown. Example positions of the STFT windows are indicated. These windows are dH(H=STFT window hop size) time domain samples apart. Applying the STFT to these windowed signal portions yields X(i,k−d) and Y(i,k). Additionally, a further by one delayed loudspeaker spectrum, X(i,k−d−1) is used (possibly more successively delayed spectra may be used). The coloration correction estimation (CE in figure) yields the real-valued gain filters, $G_1(i,k)$ and $G_2(i,k)$, mimicking the coloration effect of the acoustic echo path on the loudspeaker signal. The gain filter, G(i,k), which is applied to the microphone signal spectra for echo removal, Y(i,k), is computed as a function of X(i,k−d), X(i,k−d−1), $G_1(i,k)$, $G_2(i,k)$, and Y(i,k), by e.g. (8) or (9) with (20). Finally, the gain filter is applied to the microphone spectra (6) (SM in the figure) before the inverse STFT is applied with overlap add.

Adaptive estimation of the delay d and coloration correction for the alternative implementation: Given the normalized cross-correlation functions (12) the delays with the largest cross-correlation are computed $$d_1(i) = \mathop{\mathrm{argmax}}_{b} \phi(i, b, k) \quad (21)$$

$$d_2(i) = \mathop{\mathrm{argmax}}_{b \neq d_1} \phi(i, b, k)$$

The delay is then computed as $d(i)=\min\{d_1(i), d_2(i)\}$. The coloration correction values are computed such that the delayed and coloration corrected loudspeaker magnitude spectrum (20) approximates the microphone signal magnitude spectrum in a least mean square error sense, e.g. by $$G_1(i,k) = \frac{a_{12}(i, d(i), k)a_{22}(i, d(i), k) - a_{12}(i, d(i)+1, k)a_3(i, d(i), k)}{a_{22}(i, d(i), k)^2 - a_3(i, d(i)k)^2} \quad (22)$$

$$G_2(i,k) = \frac{a_{12}(i, d(i)+1, k)a_{22}(i, d(i), k) - a_{12}(i, d(i), k)a_3(i, d(i), k)}{a_{22}(i, d(i), k)^2 - a_3(i, d(i)k)^2}$$

where $a_{11}$, $a_{12}$, and $a_{22}$ are computed according to (13) and $$a_3(i,b,k) = \epsilon |X(i,k-b)X(i,k-b-1)| + (1-\epsilon)a_3(i,b,k-1) \quad (23)$$

Here we have assumed $\delta=1$ in (20). Similar equations could be written for different values for $\delta$.

Alternative Estimation of the Color Correction Factors $G_1(i,k)$ and $G_2(i,k)$:

The gain filters, $G_1(i,k)$ and $G_2(i,k)$ can be estimated using adaptive filters. For this purpose, (20) is re-written as $$|\hat{Y}(i,k)|^\delta = G_1(i,k)|X(i,k-d)|^\delta + G_2(i,k)|X(i,k-d-1)|^\delta \quad (24)$$

The mean square estimation error measured that is minimized is $$J(G_1(i,k), G_2(i,k)) = E\left\{ \left(|Y(i,k)|^\delta - |\hat{Y}(i,k)|^\delta\right)^2 \right\} \quad (24)$$

$$= E\{(|Y(i,k)|^\delta - G_1(i,k)|X(i,k-d)|^\delta - G_2(i,k)|X(i,k-d-1)|^\delta)^2\}$$

Adaptive filter algorithms are used for each i (i=STFT spectral coefficient index) to adapt $G_1(i,k)$ and $G_2(i,k)$ such that the mean square error (25) is minimized. Suitable algorithms include normalized least-mean-square (NLMS), recursive least-squares (RLS), proportionate NLMS (PN-LMS), affine projection algorithm (APA), etc.

Improving the perceptual quality: When applying the previously described techniques for computing the gain filter for removing the echo, G(i,k) the near-end speech signal is likely to be distorted during double talk. It is a well known fact, that spectral suppression causes artifacts. Some of these artifacts are sometimes called "musical tone" artifacts.

Figure 10:
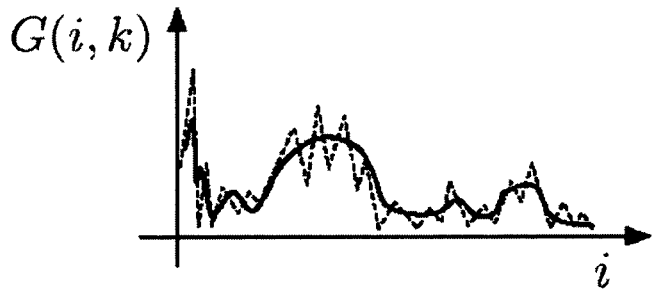
FIG. 10 shows a method for smoothing the gain filter for decreasing the potential for artifacts.

To reduce the artifacts occurring from applying the gain filter, G(i,k), to the microphone signal spectra, Y(i,k), the gain filter is smoothed as a function of frequency. Motivated by the fact that the auditory system integrates signal over frequency, i.e. evaluating loudness of a signal with only limited frequency resolution, the gain filter is smoothed. The frequency resolution of the auditory system is lower at low frequencies than at high frequencies. Thus, more smoothing can be applied at high frequencies. An example for this smoothing is illustrated in FIG. 10, where the dashed line is the non-smoothed gain filter and the solid line is the smoothed gain filter. We implemented the smoothing by applying a lowpass filter along frequency (i) to G(i,k).

Figure 11:
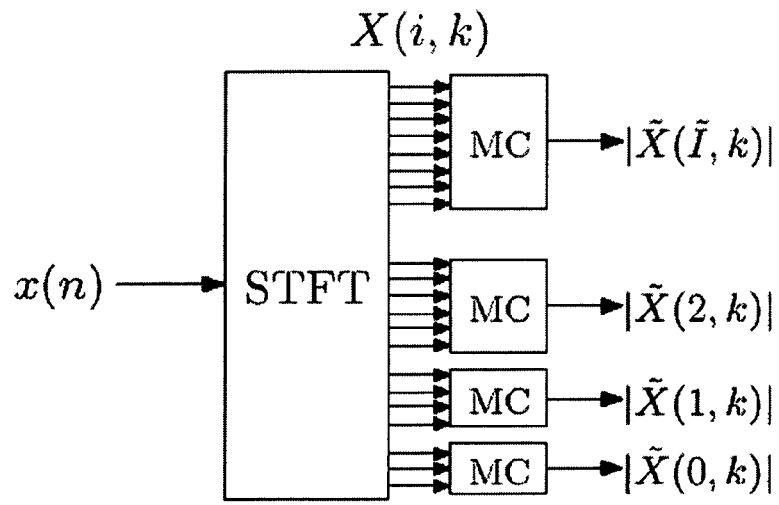
FIG. 11 shows a block diagram in which the given STFT spectra, magnitude spectra with lower frequency resolution are computed by combining the STFT magnitude spectra.

Reducing computational complexity: Considering that the gain filter is smoothed, the coloration correction values, $G_v(i,k)$ or $G_1(i,k)$ and $G_2(i,k)$, can directly be computed with lower frequency resolution (as opposed to carrying out the estimation for each spectrum index i). This is achieved by using magnitude (or power) spectra with lower frequency resolution than the STFT. FIG. 11 illustrates how magnitude spectra are computed with lower frequency resolution. First the time-domain signal, x(n), is converted to the short-time spectral domain, X(i,k), by applying windowing and the STFT. The spectral coefficients are then grouped and magnitude combiners (MC in the figure) are used for computing a combined magnitude given the spectral coefficients of a group, $$|\tilde{X}(o,k)| = \left( \sum_{i_{0_1}}^{i_{0_2}} |X(i,k)|^\kappa \right)^{\frac{1}{\kappa}} \quad (26)$$

where $i_{0_1} \leq i \leq i_{0_2}$ are the STFT spectral coefficient indices belonging to the group with index o and $\kappa$ determines how the spectra are combined. We are using $\kappa=2$, i.e. we are adding the power values of the spectral coefficients.

Figure 12:
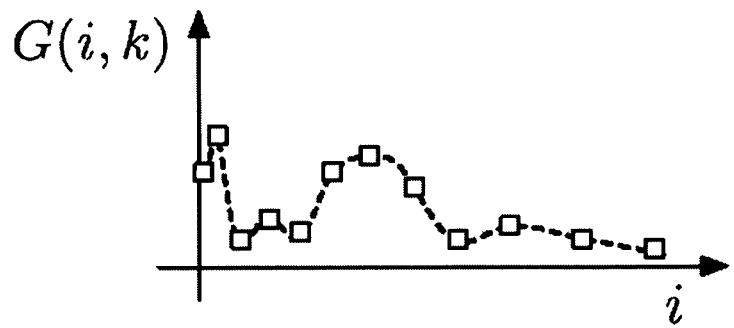
FIG. 12 shows an interpolation from the combined magnitude gain filter to obtain the gain filter.

The described processing is applied to X(i,k) and Y(i,k) and the echo estimations, coloration correction values, and/or noise estimations are carried out using the reduced number of magnitude spectral coefficients $\tilde{X}(o,k)$ and (26). Also the gain filter is computed using the reduced number of coefficients. Before applying the gain filter to the microphone signal spectra for echo/noise removal, the fewer gain filter coefficients are expanded such that for each STFT coefficient a gain filter coefficient is available. This expansion is illustrated in FIG. 12. Given are the combined magnitude gain filter estimates (squares in the figure), $\tilde{G}(o,k)$, and by applying interpolation between these values (we use linear interpolation) the gain filter, G(i,k) (dashed line in the figure) is obtained.

For a sampling frequency of 16 kHz our system uses an STFT window size W=256 samples and a window hop size H=128 samples. This results in I=129 STFT spectral coefficients (ignoring the symmetric negative frequencies). By using (26), we compute $\tilde{I}=18$ combined magnitudes. Thus, the computational complexity is significantly reduced.

Multi-Channel Acoustic Echo Suppressor

Figure 16:
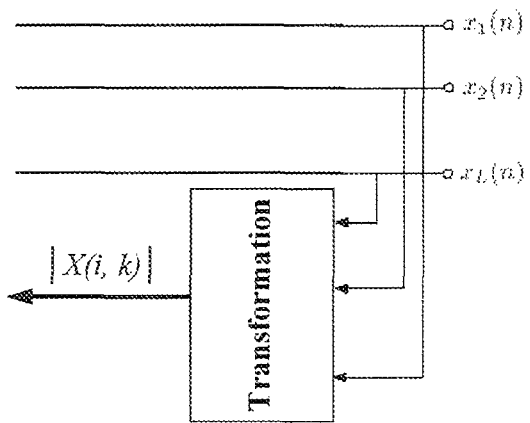
FIGS. 16-18 illustrate computing of combined loudspeaker signal short-time spectra.
Figure 17:
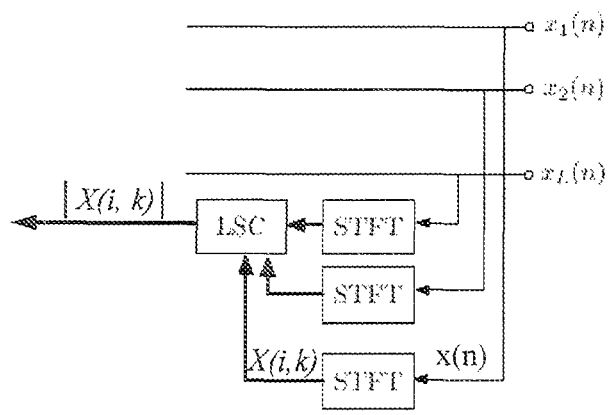
Figure 18:
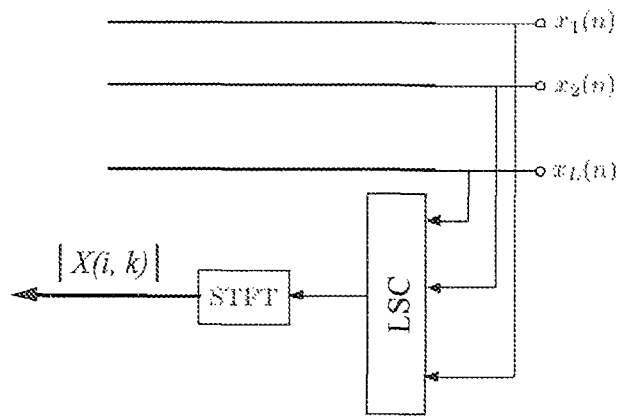

FIGS. 16-18 illustrate computing of combined loudspeaker signal short-time spectra. Specifically, FIG. 16 illustrates computing a combined loudspeaker signal short-time spectrum |X(i, k)| from the loudspeaker signals x(n). FIG. 17 illustrates computation of the combined loudspeaker signal short-time spectrum |X(i, k)| by converting the loudspeaker signals x(n) to short-time spectra X(i,k) and combining them. FIG. 18 illustrates computation of the combined loudspeaker signal short-time spectrum |X(i, k)| by combining the loudspeaker signals in the time domain and they computing a short-time spectrum of the combined signal. Note that each of the processes illustrated in FIGS. 16-18 may also be applied to compute a combined microphone signal short-time spectrum |Y(i, k)| from the microphone signals y(n).

Another aspect of the invention enables application of mono AES principles to the case when multiple loudspeakers and microphones are used for multi-channel tele-conferencing. As opposed to conventional AEC or AES, there is no need for distorting the loudspeaker signals. Since not the acoustic echo paths are explicitly estimated, there is also no non-uniqueness problem and thus no need for distorting the loudspeaker signals.

We observed that the coloration correction estimation of echo paths from two loudspeakers in a desktop stereo system (e.g. personal computer with two loudspeakers) are quite similar for the left and right loudspeakers (if there is reasonable symmetry, i.e. if the microphone is not placed much closer to one loudspeaker than the other). We did this experiment with an omnidirectional microphone. If directional microphones are used, the coloration effect is still similar, but the overall gain depends on the direction at which the loudspeaker is located. Often stereo microphones are designed such that the sum of left and right has an omnidirectional property (i.e. the gain the of left and right sum does not depend on direction). This omnidirectional property of the sum signal, motivated us to combine the left and right microphone signals to one and treat it the same as a single microphone signal for gain filter, $G(i,k)$, computation. Spinning this thought further, we also tried to combine the loudspeaker signals to a single signal for gain filter computation. In the end, we had a system effectively using mono gain filter computation applicable for multi-channel AES. In the following, we are describing this processing in detail.

Figure 13:
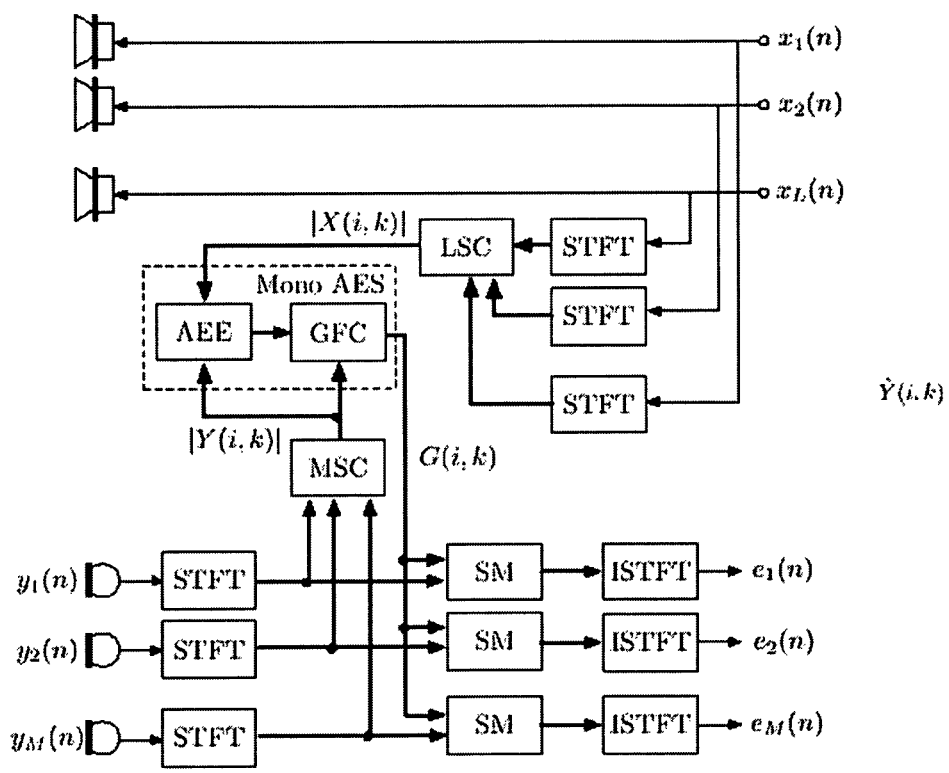
FIG. 13 shows a block diagram of the proposed technique for multi-channel AES by means of combining multiple loudspeaker and microphone signal spectra to combined spectra.

FIG. 13 shows how the proposed scheme for mono AES is extended for multi-channel acoustic echo suppression. A loudspeaker signal combiner (LSC) and microphone signal combiner (MSC) generate a single composite loudspeaker and microphone signal magnitude spectrum, respectively. A mono acoustic echo suppression (AES) algorithm is operated using the composite signal spectra. The so-obtained gain filter $G(i,k)$ is applied individually to each microphone signal channel. Bold lines represent a plurality of spectral coefficients or subbands. Note that the AEE block in the figure corresponds a method for estimating an echo signal spectrum, possibly by applying a delay and coloration correction to the loudspeaker signal, i.e. (10) or (20), or possibly another method could be used. A loudspeaker signal combiner (LSC) combines the loudspeaker signal spectra and generates a "combined" magnitude spectrum $|X(i,k)|$. The loudspeaker signals are combined as $$|X(i,k)| = \left(\sum_{l=1}^{L} g_{xl}|X_l(i,k)|^\theta\right)^{\frac{1}{\theta}} \qquad (27)$$

where $\theta$ controls the combination process and $g_{x1}$ are weighting factors for each signal. We use $\theta=2$ and $g_{xl}=1$.

Similarly, a microphone signal combiner (MSC) combines the microphone signal spectra, $$|Y(i,k)| = \left(\sum_{m=1}^{M} g_{y_m}|Y_m(i,k)|^\lambda\right)^{\frac{1}{\lambda}} \qquad (28)$$

where $\lambda$ controls the combination process and $g_{ym}$ are weighting factors. We use $\lambda=2$ and $g_{ym}=1$. An alternative method for combining the microphone signals is $$|Y(i,k)| = \left|\sum_{m=1}^{M} g_{y_m} Y_m(i,k)\right| \qquad (29)$$

The weighting factors, $g_{xl}$ and $g_{ym}$, are not chosen all the same if the system is not close to symmetric, i.e. if one loudspeaker is much closer to microphones than other loudspeakers.

Given the combined magnitude spectra, $|X(i,k)|$ and $|Y(i,k)|$, the gain filter, $G(i,k)$ is computed similarly as in the mono AES case, as illustrated in FIG. 13. That is, the echo magnitude spectrum $|\hat{Y}(i,k)|$ is estimated and the gain filter $G(i,k)$ is computed, e.g. by (8) or (9). Spectral modification is then applied to each of the microphone signals $1 \leq m \leq M$ individually, using the same gain filter $G(i,k)$, $$E_m(i,k) = G(i,k)Y_m(i,k) \qquad (30)$$

The echo suppressed output signals $e_m(n)$ are obtained by applying the inverse STFT with overlap add to $E_m(i,k)$.

Multi-Channel Noise Suppressor

Figure 14:
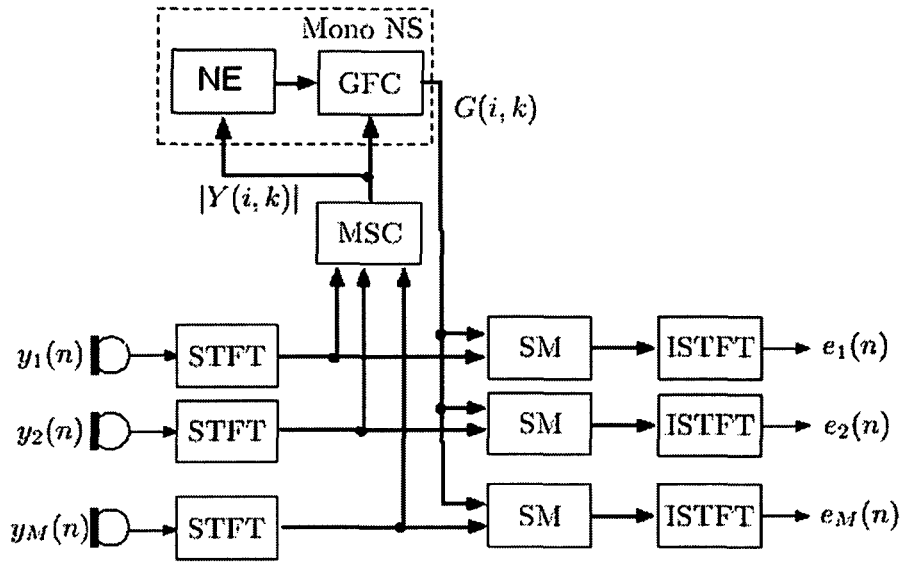
FIG. 14 shows a block diagram of the proposed technique for multi-channel NS by means of combining multiple microphone signal spectra to combined spectra.

Another aspect of the invention is that similar processing as described for multi-channel AES is also applied to NS, for doing multi-channel NS. Mono NS gain filter computation applied for multi-channel NS is illustrated in FIG. 14. A microphone signal combiner (MSC) is used to generate a single composite microphone signal magnitude spectrum and generates a "combined" magnitude spectrum $|Y(i,k)|$. A mono noise suppression (NS) algorithm is operated using the composite spectra to compute the gain filter $G(i,k)$, which is applied individually to each microphone signal channel. Bold lines represent a plurality of spectral coefficients or subbands. The microphone signals are combined as $$|Y(i,k)| = \left(\sum_{m=1}^{M} g_{y_m}|Y_m(i,k)|^\lambda\right)^{\frac{1}{\lambda}} \qquad (31)$$

where $\lambda$ controls the combination process and $g_{ym}$ are weighting factors. We use $\lambda=2$ and $g_{ym}=1$. An alternative method for combining the microphone signals is $$|Y(i,k)| = \left|\sum_{m=1}^{M} g_{y_m} Y_m(i,k)\right| \qquad (32)$$

Given the combined magnitude spectra, $|Y(i,k)|$, the gain filter, $G(i,k)$, is computed similarly as in the mono NS case, as illustrated in FIG. 14. That is, the noise magnitude spectrum $\hat{W}(i,k)$ is estimated and the gain filter $G(i,k)$ is computed, e.g. by (7). Spectral modification is then applied to each of the microphone signals $1 \leq m \leq M$ individually, using the same gain filter $G(i,k)$, $$E_m(i,k) = G(i,k)Y_m(i,k) \qquad (33)$$

The noise suppressed output signals $e_m(n)$ are obtained by applying the inverse STFT with overlap add to $E_m(i,k)$.

Putting it all Together

Figure 15:
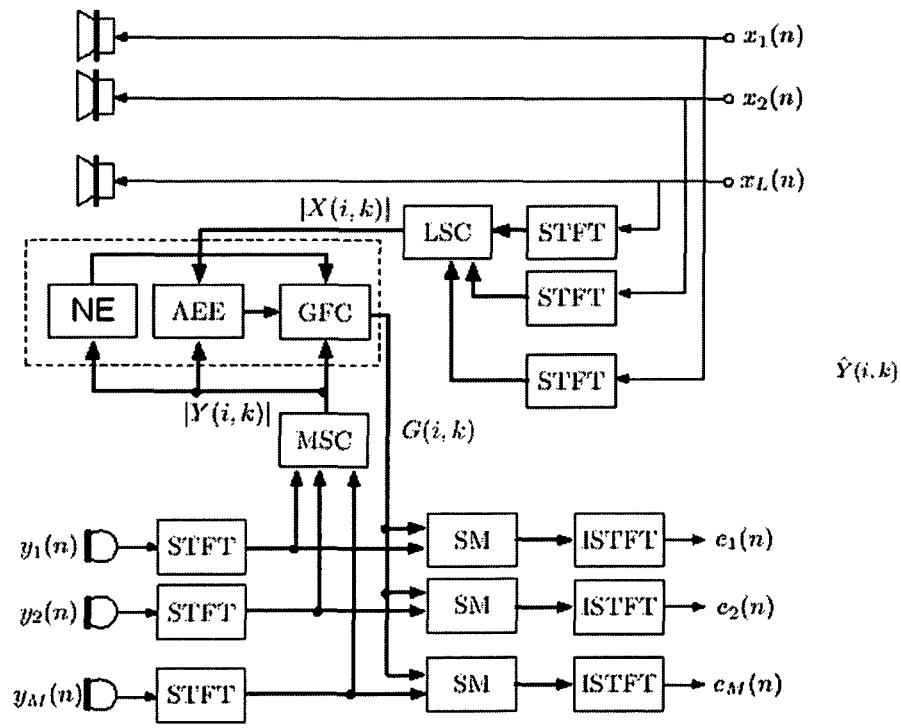
FIG. 15 shows a block diagram of the proposed technique for multi-channel AES.

All the previously described aspects of the invention are combined to a scalable system for AES and NS, illustrated in FIG. 15 showing a block diagram of the proposed technique for multi-channel AES. A loudspeaker signal combiner (LSC) and microphone signal combiner (MSC) generate a single composite loudspeaker and microphone signal magnitude spectrum, respectively. An hybrid echo/noise suppression algorithm is operated using the composite signal spectra. The so-obtained gain filter G(i,k) is applied individually to each microphone signal channel. Bold lines represent a plurality of spectral coefficients or subbands. The gain filter, applied to all microphone signals, is computed (9) as a function of the combined microphone signal |Y(i,k)|, the echo estimate |Ŷ(i,k)|, e.g. (10) or (20), and noise estimate |Ŵ(i,k)|. For low computational complexity, the previously described method for reducing the number of spectral magnitudes is used.

Implementation

The device carrying out the invention can be realised in a single silicon chip and embedded in various communication devices such as telephone, voice over IP, to speech communication device, hand-free communication device, mobile or wired telephone, PDA, webcam, video conferencing system. It could be part of a larger audio processing device having more functionalities.

With current audio (or speech) processing device, the invention can be implemented in software with the corresponding processing power.

REFERENCES

[1] C. Avendano, "Acoustinc echo suppression in the STFT domain" in Proc. IEEE Workshop on Appl. of Sig. Proc. to Audio and Acoustic, October 2001
[2] C. Faller and J. Chen, "Suppressing acoustic echo in a sampled auditory envelope space" in Proc. IEEE Workshop on Appl. of Sig. Proc. to Audio and Acoustic, August, 2003
[3] M. M. Sondhi, D. R. Morgan, and J. L Hall, "Stereophonic acoustic echo cancellation—an overview of the fundamental problem" IEEE Signal Processing Left., vol. 2, pp. 148-151, August 1995

The invention claimed is:

1. A method for processing at least two audio loudspeaker signals and at least one input microphone signal, the method comprising:
   computing a combined loudspeaker signal short-time spectrum from the loudspeaker signals;
   computing a combined microphone signal short-time spectrum from the at least one microphone signal;
   estimating a magnitude or power spectrum of an echo in the combined microphone signal short-time spectrum;
   after estimating the magnitude or power spectrum of the echo in the combined microphone signal short-time spectrum, computing a gain filter for magnitude modification of each at least one input microphone short-time spectrum;
   applying the gain filter separately to each at least one input microphone short-time spectrum in order to obtain a filtered input microphone spectrum; and
   converting each filtered input microphone spectrum into a time domain;
   wherein the magnitude or power spectrum of the echo is estimated by:
      estimating a delay and coloration correction values modeling an effect of an echo path; and
      multiplying a delayed loudspeaker subband magnitude with the coloration correction values to obtain the echo signal magnitude spectrum.

2. The method of claim 1, wherein the combined loudspeaker signal short-time spectrum is computed by converting the loudspeaker signals to short-time spectra and combining them.

3. The method of claim 1, wherein the combined loudspeaker signal short time spectrum is computed by combining the loudspeaker signals in the time domain and then computing a short-time spectrum of the combined signal.

4. The method of claim 1, wherein the combined microphone signal short-time spectrum is computed by converting the microphone signals to short-time spectra and combining them.

5. The method of claim 1, wherein the combined microphone signal short-time spectrum is computed by combining the microphone signals in the time domain and then computing a short time spectrum of the combined signal.

6. The method of claim 1, wherein the gain filter for echo removal is computed as a function of the estimated echo magnitude or power spectrum and combined microphone signal short-time spectrum.

7. The method of claim 1, wherein the gain filter for noise removal is computed as a function of an estimated noise magnitude or power spectrum and combined microphone signal short-time spectrum.

8. The method of claim 1, wherein the gain filter for echo and noise removal is computed as a function of the estimated echo and noise magnitude or power spectrum and combined microphone signal short-time spectrum.

9. The method of claim 1, wherein the magnitude or power spectrum of the echo is estimated by:
   estimating an echo path with at least one adaptive filter;
   filtering the loudspeaker signals with adaptive filter coefficients from the at least one adaptive filter; and
   computing the magnitude or power spectrum of filtered loudspeaker signals.

10. A device for processing audio signals, the device comprising:
   a microphone input for receiving at least one microphone signal;
   a loudspeaker combination module configured to compute a combined loudspeaker signal short-time spectrum from loudspeaker signals;
   a microphone combination module configured to compute a combined microphone signal short-time spectrum from input microphone signals;
   an echo estimation module configured to estimate a magnitude or power spectrum of an echo in the combined microphone signal spectrum;
   a gain filter computation module configured to compute a gain filter for magnitude modification of each input microphone spectrum after the echo estimation module estimates the magnitude or power spectrum of the echo in the combined microphone signal spectrum;
   a combination module configured to apply the gain filter to each input microphone spectrum separately; and
   a conversion module configured to convert each filtered input microphone spectrum into a time domain;
   wherein the echo estimation module is configured to estimate the magnitude or power spectrum of the echo by:
      estimating a delay and coloration correction values modeling an effect of an echo path; and
      multiplying a delayed loudspeaker subband magnitude with the coloration correction values to obtain the echo signal magnitude spectrum.

11. The device of claim 10, wherein the loudspeaker combination module determines the combined loudspeaker signal short-time spectrum based on the combination in the time domain of the loudspeaker signals.

12. The device of claim 10, wherein the loudspeaker combination module determines the combined loudspeaker signal short-time spectrum based on the combination in spectra domain of transformed loudspeaker signals in short-time spectra domain each by means of a loudspeaker conversion module.

13. The device of claim 10, wherein the microphone combination module determines the combined microphone signal short-time spectrum based on the combination in the time domain of the input microphone signals.

14. The device of claim 10, wherein the microphone combination module determines the combined microphone signal short-time spectrum based on the combination in spectra domain of transformed microphone signals in short-time spectra domain each by means of a microphone conversion module.

15. The device of claim 10, wherein the gain filter computation module computes the gain filter for echo removal as a function of the estimated echo magnitude or power spectrum and combined microphone signal short-time spectrum.

16. The device of claim 10, wherein the gain filter computation module computes the gain filter for noise removal as a function of an estimated noise magnitude or power spectrum and combined microphone signal short-time spectrum.

17. The device of claim 10, wherein the gain filter computation module computes the gain filter for echo and noise removal as a function of the estimated echo and noise magnitude or power spectrum and combined microphone signal short-time spectrum.

18. The device of claim 10, wherein the echo estimation module estimates the magnitude or power spectrum of the echo by:
   estimating an echo path with at least one adaptive filter;
   filtering the loudspeaker signals with adaptive filter coefficients from the at least one adaptive filter; and
   computing the magnitude or power spectrum of filtered loudspeaker signals.

19. The device of claim 10, wherein it is embedded in a single silicon chip.

20. The device of claim 10, wherein it is part of a speech processing device.

21. The device of claim 10, wherein it is implemented in software within a speech processing device.

* * * * *